United States Patent [19]
Wen

[11] Patent Number: 5,869,373
[45] Date of Patent: Feb. 9, 1999

[54] NAND-STRUCTURED AND AMORPHOUS SILICON BASED READ-ONLY MEMORY DEVICE AND METHOD OF FABRICATING THE SAME

[75] Inventor: Jemmy Wen, Hsinchu, Taiwan

[73] Assignee: United Microelectronics Corp., Hsinchu, Taiwan

[21] Appl. No.: 857,859

[22] Filed: May 16, 1997

[30] Foreign Application Priority Data

Mar. 27, 1997 [TW] Taiwan ................................. 86103969

[51] Int. Cl.[6] ............................................... H01L 21/8234
[52] U.S. Cl. ........................................... 438/275; 438/282
[58] Field of Search .......................... 438/128, 275–279, 438/282; 257/390–392

[56] References Cited

U.S. PATENT DOCUMENTS

5,510,287  4/1996  Chen et al. ................................ 437/52
5,616,946  4/1997  Hsu et al. ................................ 257/390
5,627,091  5/1997  Hong ....................................... 438/276

*Primary Examiner*—Joni Chang
*Attorney, Agent, or Firm*—Finnegan, Henderson, Farabow, Garrett & Dunner, L.L.P.

[57] ABSTRACT

A NAND-structure and amorphous-silicon based ROM device is provided. This ROM device is of the type including an array of MOSFET memory cells that are constructed based on a silicon-on-insulator (SOI) structure, so as to isolate the source/drain regions from the underlying substrate to prevent the occurrence of leakage current therebetween. Further, the SOI structure prevents occurrence of breakdown at the diode junction between the source/drain regions and the substrate for increased operating voltage. In this ROM device, the source/drain regions for the MOSFET memory cells are formed from the intrinsic amorphous-silicon, instead of highly-doped polysilicon, so that the fabrication process for the ROM device is significantly simplified.

30 Claims, 6 Drawing Sheets

NAND-STRUCTURED AND AMORPHOUS SILICON BASED READ-ONLY MEMORY DEVICE AND METHOD OF FABRICATING THE SAME

BACKGROUND OF THE INVENTION

1. Field of the Invention

This invention relates to semiconductor memory devices, and more particularly, to a NAND-structured amorphous silicon based semiconductor read-only memory (ROM) device, of the type including an array of MOSFET (metal-oxide semiconductor field-effect transistor) memory cells whose source/drain regions are formed from amorphous silicon and constructed based on a silicon-on-insulator (SOI) structure.

2. Description of Prior Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the binary code to be permanently stored in ROMs is usually first defined by the customer and then furnished to the factory to be programmed into the ROMs.

Most ROMs are identical in semiconductor structure except for the different binary code stored therein. Therefore, the ROM devices can be fabricated up to the stage ready for data programming and then the semi-finished products are stocked in inventory awaiting customer orders. The customer then furnishes the data to the factory where the data are stored into the semi-finished ROMs by using the so-called mask-programming process. This procedure is now a standard method in the semiconductor industry for fabricating ROMs.

In most conventional ROMs, metal-oxide semiconductor field-effect transistors (MOSFET) are used as the memory cells for permanent storage of binary data. In the mask-programming process stage, an impurity material is doped into selected channel regions so as to provide the associated memory cells with different threshold voltage levels representing the storage of different values of the binary-coded data. Whether one MOSFET memory cell is set to store a binary digit of 0 or 1 depends on whether the associated channel region is doped with impurities or not. If one channel region is doped with impurities, the associated MOSFET memory cell is set to a low threshold voltage, effectively setting the MOSFET memory cell to a permanently-ON state representing the storage of a first binary digit, for example 0; otherwise, the MOSFET memory cell is set to a high threshold voltage, effectively setting the MOSFET memory cell to a permanently-OFF state representing the storage of a second binary digit, for example 1.

Figure 1A:
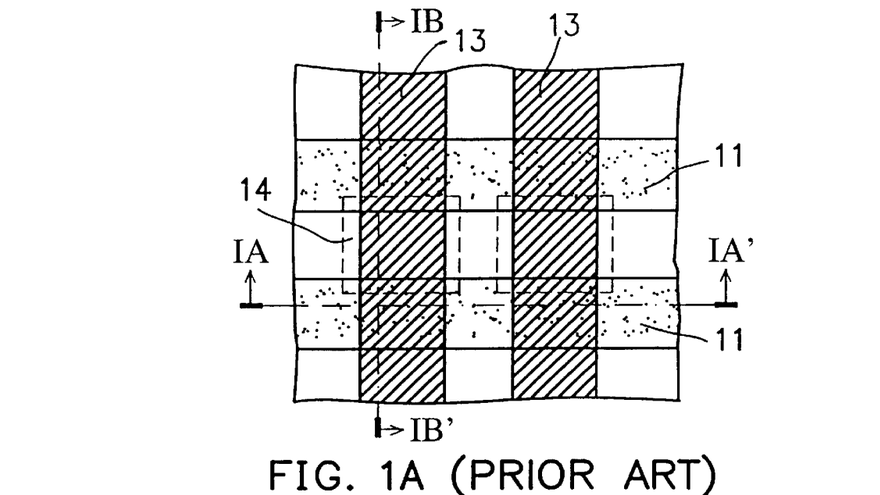
FIG. 1A is a schematic top plan view of a conventional ROM device.
Figure 1B:
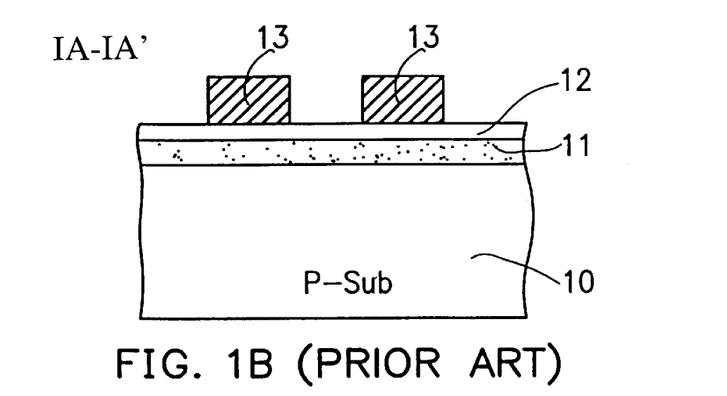
FIG. 1B is a schematic sectional view of the conventional ROM device of FIG. 1A cut along the line IB—IB.
Figure 1C:
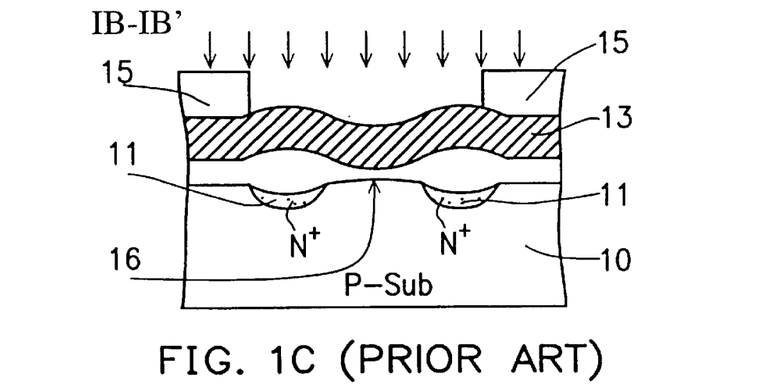
FIG. 1C is a schematic sectional view of the conventional ROM device of FIG. 1A cut along the line IC—IC.

One conventional ROM device is shown in FIGS. 1A through 1C, in which FIG. 1A is a schematic top view of the ROM device; FIG. 1B is a cross-sectional view of the ROM device of FIG. 1 cut along the line IB—IB; and FIG. 1C is a cross-sectional view of the ROM device of FIG. 1 cut along the line IC—IC.

As shown, the conventional ROM device includes a semiconductor substrate, such as a P-type silicon substrate, on which a plurality of parallel-spaced bit lines 11 and a plurality of parallel-spaced word lines 13 crossing the bit lines 11 are formed. The word lines 13 are isolated from the underlying bit lines by an oxidation layer 12. This ROM device includes an array of MOSFET memory cells 14, each being associated with one segment of the word lines 13 between each neighboring pair of bit lines 11.

As shown in FIG. 1C, in the method for fabricating the conventional ROM device, the first step is to conduct an ion-implantation process so as to dope an N-type impurity material, such as arsenic (As), into selected regions of the substrate 10 to form a plurality of parallel-spaced diffusion regions serving as the bit lines 11. The interval region between each neighboring pair of the bit lines 11 serves as a channel region 16. Subsequently, a thermal oxidation process is performed on the wafer so as to form the oxidation layer 12 over the entire top surface of the wafer. Next, a conductive layer, such as a highly-doped polysilicon layer is formed over the wafer, and then selectively removed through a photolithographic and etching process. The remaining portions of the conductive layer serve as the word lines 13. This completes the fabrication of a semi-finished product of the ROM device awaiting for customer order.

In the mask-programming process, a mask layer 15 is first formed over the wafer. This mask layer 15 is predefined to form a plurality of contact windows according to the bit pattern of the binary-coded data that are to be programmed into the ROM device for permanent storage. These contact windows expose those channel regions that are associated with a selected group of the MOSFET memory cells of the ROM device that are to be set to a permanently-ON state. The covered MOSFET memory cells are to be set to a permanently-OFF state. Subsequently, an ion-implantation process is performed on the wafer so as to dope a P-type impurity material, such as boron (B), through the contact windows in the mask layer 15 into the exposed channel regions. This completes the so-called code implantation process.

In the finished product of the ROM device, the doped channel regions cause the associated MOSFET memory cells to be set to a low threshold voltage, effectively setting those MOSFET memory cells to a permanently-ON state representing the permanent storage of a first binary digit, for example 0. On the other hand, the undoped channel regions cause the associated MOSFET memory cells to be set to a high threshold voltage, effectively setting those MOSFET memory cells to a permanently-OFF state representing the permanent storage of a second binary digit, for example 1.

In the foregoing ROM device, since the source/drain regions are formed in the substrate by ion implantation, the isolation between the source/drain regions and the substrate is poor. Moreover, since a diode junction is used for the isolation of the source/drain regions from the substrate, the leakage current will be increased as the applied voltage is increased. Still further, since the magnitude of this leakage current is proportional to the contact area between the source/drain regions and the substrate, the operating voltage is limited to a small magnitude for prevention of a large leakage current.

SUMMARY OF THE INVENTION

It is therefore a primary object of the present invention to provide a ROM device which is built on a silicon-on-insulator (SOI) structure so as to provide isolation between the source/drain regions and the underlying substrate to prevent the occurrence of leakage current therebetween.

It is another object of the present invention to provide a ROM device which is built on an SOI structure which can prevent the occurrence of breakdown at the diode junction between the source/drain regions and the substrate for increased operating voltage.

It is still another object of the present invention to provide a method for fabricating the foregoing ROM device.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a new ROM device and a method for fabricating the same are provided. This ROM device includes an array of MOSFET memory cells that are NAND-structured and amorphous silicon based.

The method in accordance with the invention for fabricating this NAND-structured and amorphous silicon based ROM device includes the steps of preparing a semiconductor substrate and forming a first insulating layer over the substrate; forming an intrinsic amorphous-silicon layer over the first insulating layer; removing selected portions of the intrinsic amorphous-silicon layer so as to form a plurality of substantially parallel spaced diffusion regions serving as a plurality of bit lines in a first direction; performing an ion-implantation process on the diffusion regions so as to dope an impurity material of a first semiconductor type into the diffusion regions to adjust the threshold voltage thereof to a predetermined level; forming a plurality of first sidewall spacers, each on a sidewall of the diffusion regions; forming a second insulating layer over all of the exposed surfaces of the first insulating layer, the diffusion regions, and the first sidewall spacers; forming a conductive layer over the second insulating layer; removing selected portions of the conductive layer so as to form a plurality of substantially parallel spaced gate regions serving as a plurality of word lines in a second direction crossing the bit lines, the crossed portions between the gate regions and the diffusion regions defining a plurality of locations where an array of memory cells are formed, the diffusion regions being partitioned into a plurality of channel regions that are located beneath the gate regions and a plurality of source/drain regions that are located between the channel regions; and forming a plurality of second sidewall spacers, each on one sidewall of the gate regions.

These steps are followed by preparing a mask which exposes a selected number of locations on the gate regions that are associated with a first selected group of the memory cells of the ROM device that are to be set to a permanently-OFF state, the unexposed locations being associated with a second selected group of the memory cells that are to be set to a permanently-OFF state; performing an ion-implantation process so as to dope an impurity material of a second semiconductor type through the mask into the associated channel regions so that the doped group of the channel regions causes the associated memory cells to be set to a permanently-OFF state, while the undoped group of the channel regions causes the associated memory cells to be set to a permanently-ON state; forming a third insulating layer to cover all of the exposed surfaces of the second insulating layer, the gate regions, and the second sidewall spacers; forming a plurality of source/drain contact windows and gate contact windows through the third insulating layer and the second insulating layer, in which the source/drain contact windows expose all of the source/drain regions, and the gate contact windows expose a selected number of locations on the gate regions that are associated with the ON-state memory cells; and filling a conductive material into the source/drain contact windows and the gate contact windows to as to form a plurality of gate electrodes respectively in the gate contact windows and a plurality of source/drain electrodes respectively in the source/drain contact windows.

In another aspect, the invention is directed to a semiconductor structure of the foregoing NAND-structured and amorphous silicon based ROM device including a semiconductor substrate, a first insulating layer formed over the substrate, a plurality of substantially parallel-spaced diffusion regions formed over the first insulating layer in a first direction serving as a plurality of bit lines, a plurality of first sidewall spacers formed on sidewalls of the diffusion regions, a second insulating layer which covers the first insulating layer, the diffusion regions, and the first sidewall spacers. The structure also including a plurality of substantially parallel-spaced gate regions formed over the second insulating layer in a second direction serving as a plurality of word lines intercrossing the bit lines, the crossed portions between the gate regions and the diffusion regions defining an array of memory cells for the ROM device, the diffusion regions being partitioned into a plurality of channel regions located beneath the gate regions and a plurality of source/drain regions between the channel regions, wherein a first selected group of channel regions that are associated with a first selected group of the memory cells that are set to a permanently-OFF state are impurity-doped, while a second selected group of the channel regions that are associated with a second selected group of the memory cells that are set to a permanently-ON state are undoped. Also included in the structure are a plurality of second sidewall spacers, each being formed on one sidewall of the gate regions, a third insulating layer formed over the second insulating layer and the gate regions, the third insulating layer being formed with a plurality of source/drain contact windows exposing all of the source/drain regions in the diffusion regions and a plurality of gate contact windows exposing a selected number of locations on the gate regions that are associated with the ON-state memory cells, a plurality of source/drain electrodes formed in the source/drain contact windows in the third insulating layer, and a plurality of gate electrodes formed in the gate contact windows in the third insulating layer.

It is to be understood that both the foregoing general description and the following detailed description are exemplary and explanatory only and are not restrictive of the invention, as claimed.

BRIEF DESCRIPTION OF THE DRAWINGS

The invention can be more fully understood by reading the following detailed description of the preferred embodiments, with reference made to the accompanying drawings, which are incorporated in and constitute a part of this specification, illustrate one embodiment of the invention and together with the description, serve to explain the principles of the invention. In the drawings.

DETAILED DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

FIGS. 2A through 2H are schematic sectional diagrams used to depict the steps involved in the method of the invention for fabricating a NAND-structured and amorphous silicon based ROM device. In particular, this ROM device is of the type including an array of MOSFET memory cells for permanent storage of binary data.

Figure 2A:
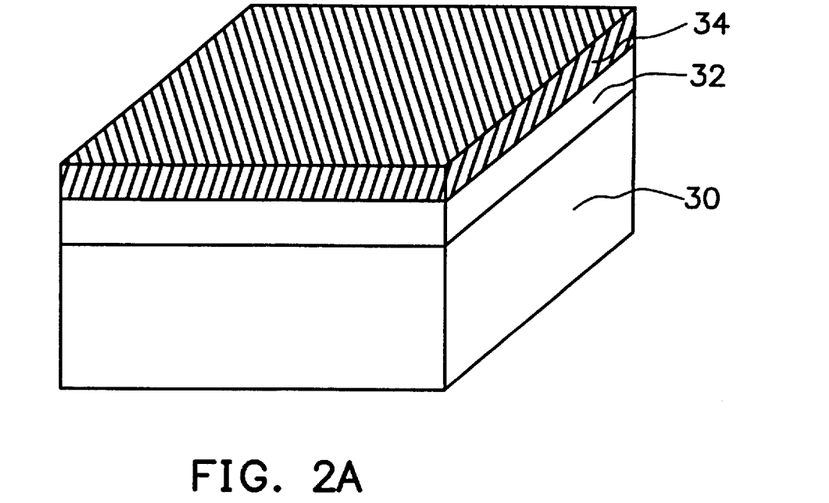
FIGS. 2A through 2E are schematic sectional perspective views depicting the steps involved in the method of the invention for fabricating a NAND-structured and amorphous silicon based ROM device.

As shown in FIG. 2A, in the first step a semiconductor substrate 30 of a first semiconductor type, such as a P-type silicon substrate, is prepared. Then, a first insulating layer 32, such as a layer of silicon dioxide or a layer of silicon nitride, is formed over the substrate 30. Subsequently, a plasma enhanced chemical-vapor deposition (PECVD) process is performed on the wafer with gaseous $SiH_4$ at a temperature of 350° C. to 575° C., whereby an intrinsic amorphous-silicon layer 34 is formed over the first insulating layer 32.

Figure 2B:
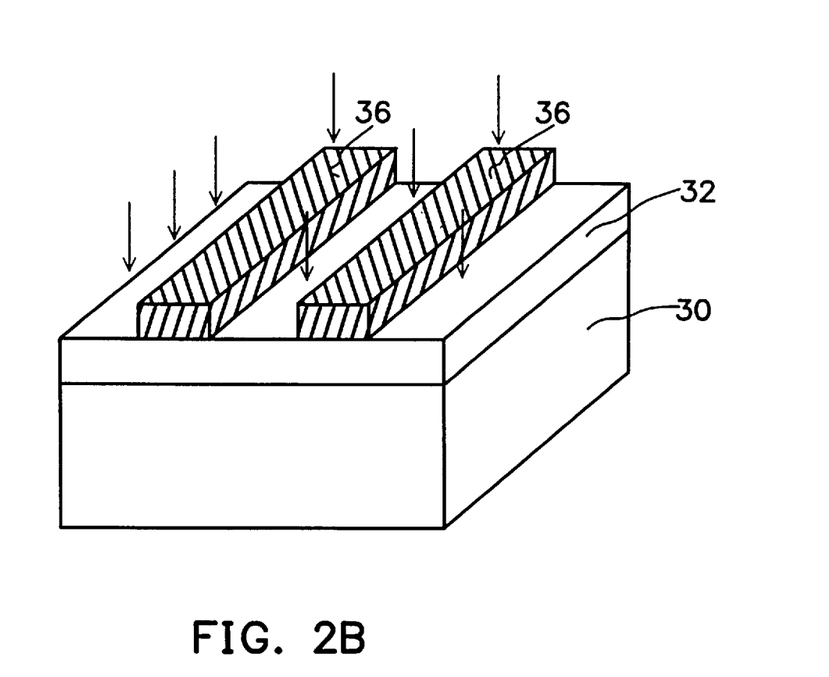

FIG. 2B shows the subsequent step where the intrinsic amorphous-silicon layer 34 is selectively removed by a photolithographic and etching process so as to form a plurality of substantially parallel and equally spaced amorphous-silicon layers 36 oriented in a first direction. Next, an ion-implantation process is performed on the wafer so as to dope an impurity material of the first semiconductor type, such as boron (B), into the amorphous silicon of the amorphous-silicon layers 36 so as to adjust the threshold voltage thereof to a predetermined level. The impurity-doped amorphous-silicon layers 36 are hereinafter referred to as diffusion regions, but are still labeled with the same reference numeral 36.

Figure 2C:
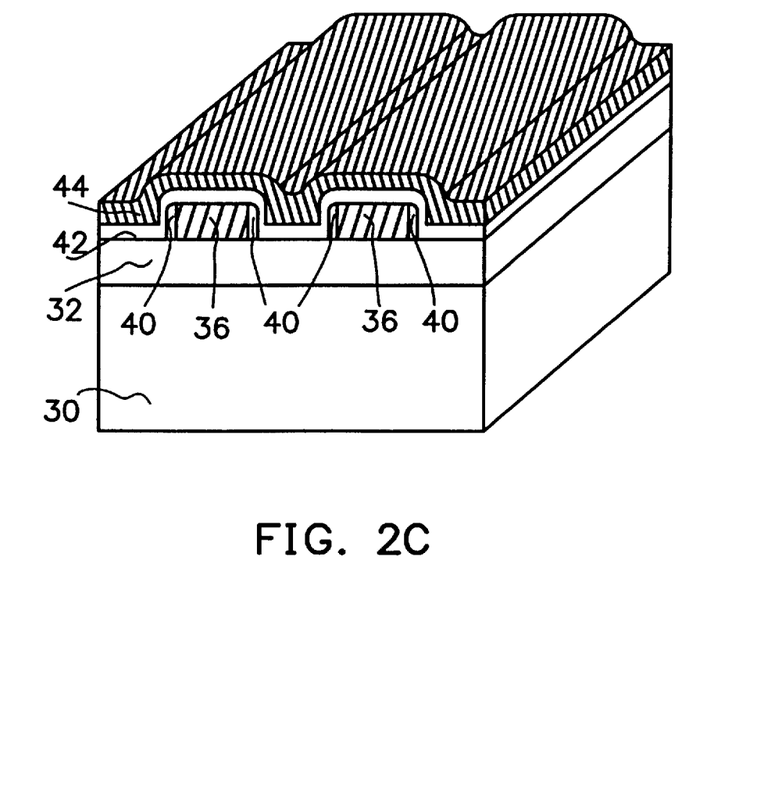

In the following step, as shown in FIG. 2C, a plurality of first sidewall spacers 40 are formed, each on one sidewall of the diffusion regions 36. These first sidewall spacers 40 can be formed, for example, by first depositing a sidewall insulating layer, such as a layer of silicon dioxide or a layer of silicon nitride, to a predetermined thickness over the entire top surface of the wafer, and then performing an anisotropic dry-etching process on the sidewall insulating layer until the top surface of the underlying insulating layer 32 is exposed. The remaining portions of the sidewall insulating layer then serve as the above-mentioned first sidewall spacers 40. After this, a second insulating layer 42, such as a layer of silicon dioxide or a layer of silicon nitride serving as a gate oxide layer, is formed by chemical-vapor deposition (CVD) over the entire top surface of the wafer, covering all of the exposed surfaces of the first insulating layer 32, the diffusion regions 36, and the first sidewall spacers 40. Subsequently, a conductive layer 44, such as a polysilicon layer, is deposited to a predetermined thickness over the entire top surface of the wafer. Due to the empty spaces between the diffusion regions 36, the polysilicon conductive layer 44 is a non-planarized layer which includes recessed portions between the diffusion regions 36.

Figure 2D:
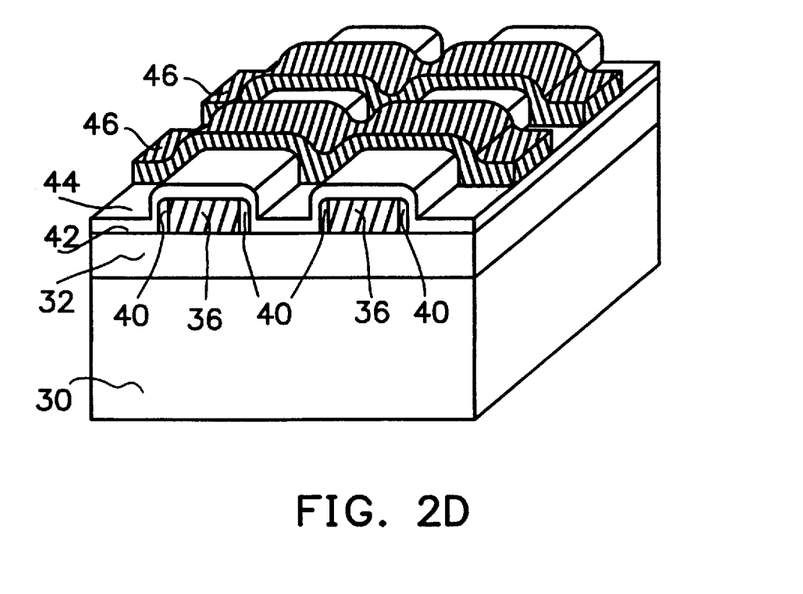

As seen in FIG. 2D, in the subsequent step the polysilicon conductive layer 44 is selectively removed by a photolithographic and etching process so as to form a plurality of substantially parallel-spaced polysilicon gate regions 46 oriented in a second direction intercrossing the diffusion regions 36 substantially at a right angle. After this, an ion-implantation process is performed on the wafer so as to dope an impurity material of a second semiconductor type into the polysilicon gate regions 46, whereby the polysilicon gate regions 46 are transformed into highly-doped polysilicon layers with increased conductivity. Since the gate regions 46 are formed over the second insulating layer 42 (which is an oxide layer) while the diffusion regions 36 are formed beneath the same, the impurity ions will be doped only into the gate regions 46 and not into the diffusion regions 36. This process is therefore self-aligning.

Figure 2E:
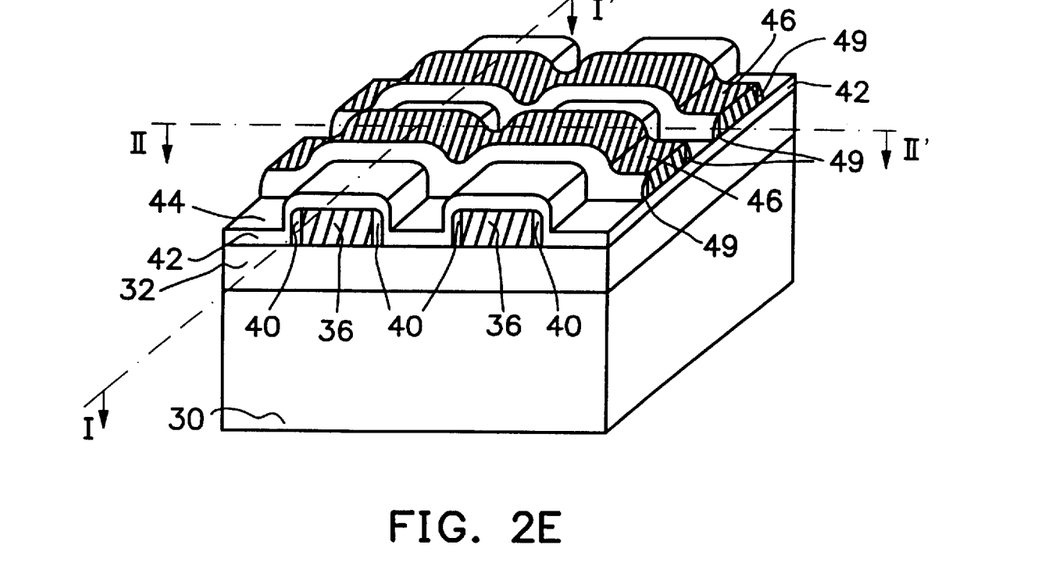

As depicted in FIG. 2E, a plurality of second sidewall spacers 49 are formed, each on one sidewall of the gate regions 46. These second sidewall spacers 49 can be formed, for example, by first depositing a sidewall insulating layer, such as a layer of silicon dioxide or a layer of silicon nitride, to a predetermined thickness over the entire top surface of the wafer, and then performing an anisotropic dry-etching process on the sidewall insulating layer until the top surface of the underlying first insulating layer 32 is exposed. The remaining portions of the sidewall insulating layer then serve as the above-mentioned second sidewall spacers 49.

Figure 2F:
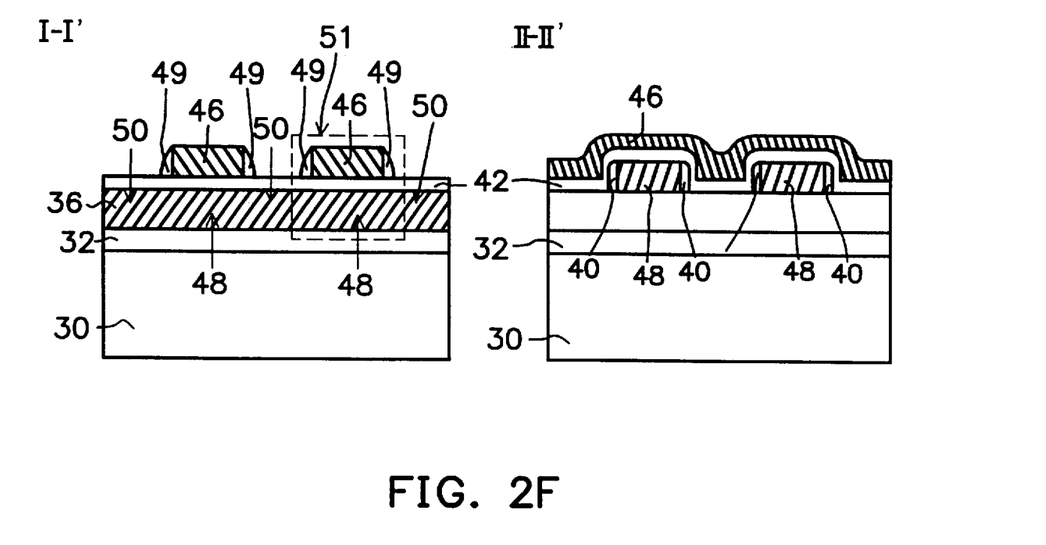
FIGS. 2F through 2H are schematic cross sectional views, each showing sections along lines I—I and II—II of FIG. 2E, depicting further steps involved in the method of the invention.

FIG. 2F shows two cross-sectional views of the wafer structure of FIG. 2E respectively cutting through the line I–I' and the line II–II'. As shown in the left diagram of FIG. 2F, the diffusion regions 36 can be partitioned into a number of portions in such a manner that those portions that are laid directly beneath the gate regions 46 serve as a plurality of channel regions, as those designated by the reference numeral 48. Those portions that are laid beneath the interval spaces between the gate regions 46 serve as a plurality of source/drain regions, as those designated by the reference numeral 50. Therefore, the intercrossed portions between the gate regions 46 and the diffusion regions 36 define an array of locations where the memory cells of the ROM device are formed. For instance, the dashed box labeled with the reference numeral 51 in the left diagram of FIG. 2F indicates one memory cell of the ROM device, which includes one channel region 48, one portion of the second insulating layer 42, one portion of the above-laid gate region 46, and two source/drain regions 50 on both sides of the channel region 48.

The foregoing process steps complete the preliminary fabrication for a semi-finished product of the ROM device which is then put in inventory awaiting customer order. Once the customer-defined binary code is received, a mask programming process is performed to write the binary code permanently into the ROM device. After this, conventional processes such as forming metal interconnects are performed to finish the production of the ROM device. These processes are described in the following with reference to FIGS. 2G, 2H, and 3.

Figure 2G:
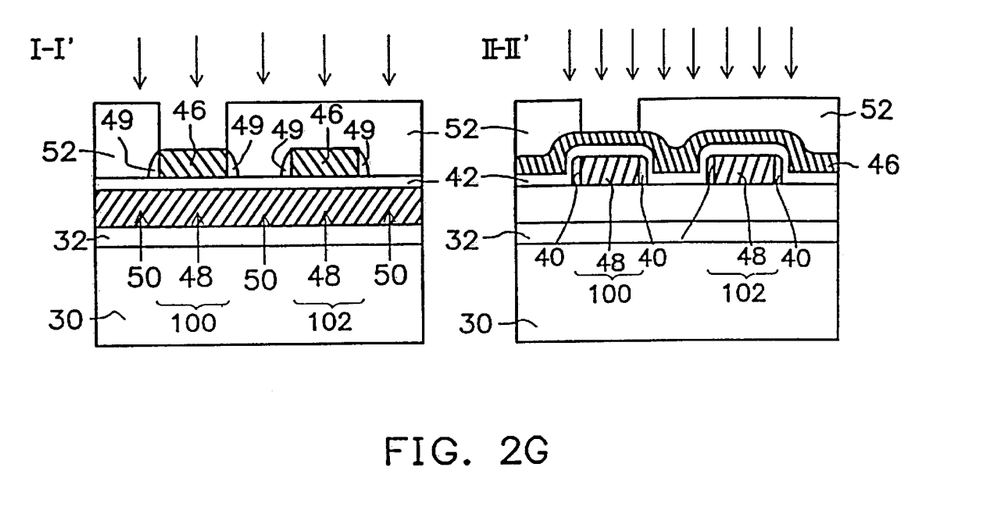

In the mask programming process depicted in FIG. 2G, the first step is to coat a photoresist layer 52 over the entire top surface of the wafer. This photoresist layer 52 is selectively removed so as to form a plurality of openings which expose a selected number of the locations on the gate regions 46 where a first selected group of the memory cells of the ROM device that are to be set to a permanently-OFF state are formed. Then, using the photoresist layer 52 as a mask, an ion-implantation process is performed on the wafer with a P-type impurity material. In this process, the impurity ions pass through the openings in the photoresist layer 52 and then penetrate through the exposed portions of the gate regions 46 and the second insulating layer 42 into the associated channel regions 48. The impurity-doped channel regions 48 cause the associated memory cells to be set to a permanently-OFF state. Conversely, the undoped channel regions 48 cause the associated memory cells to be set to a permanently-ON state. After this step, the photoresist layer 52 is removed.

In the example of FIG. 2G, one opening is formed above the memory cell indicated by the reference numeral 100, so that this memory cell 100 is set to a permanently-OFF state through the mask programming process. By contrast, the memory cell indicated by the reference numeral 102 is set to a permanently-ON state, since no opening is formed above it.

Figure 2H:
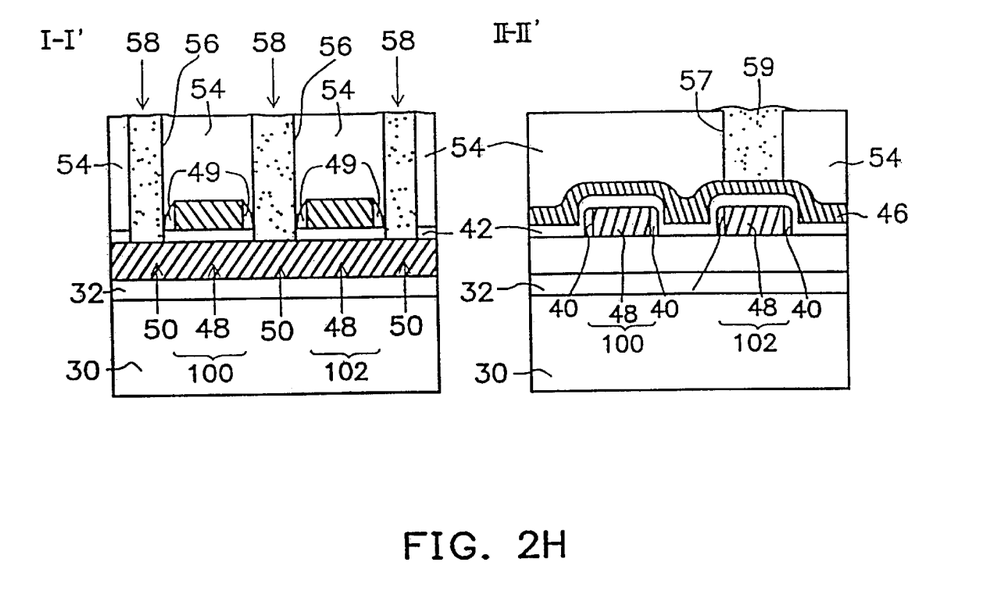

As depicted in FIG. 2H, after the mask programming process, a third insulating layer 54, such as a planarized layer of borophosphosilicate glass (BPSG), is formed over the entire top surface of the wafer. Then, the third insulating layer 54 and the second insulating layer 42 are selectively removed so as to form a plurality of source/drain contact windows 56 which expose the top surface of all of the source/drain regions 50, and a plurality of gate contact windows 57 which expose the top surface of a selected number of locations on the gate regions 46. After this, a metal, such as aluminum, is filled into all of the source/drain contact windows 56 and all the gate contact windows 57, so as to form respectively a plurality of source/drain electrodes 58 and a plurality of gate electrodes 59.

After the source/drain electrodes 58 and gate electrodes 59 are formed, all of the following processes to finish the product of the ROM device include conventional techniques which will not be described in this specification.

Figure 3:
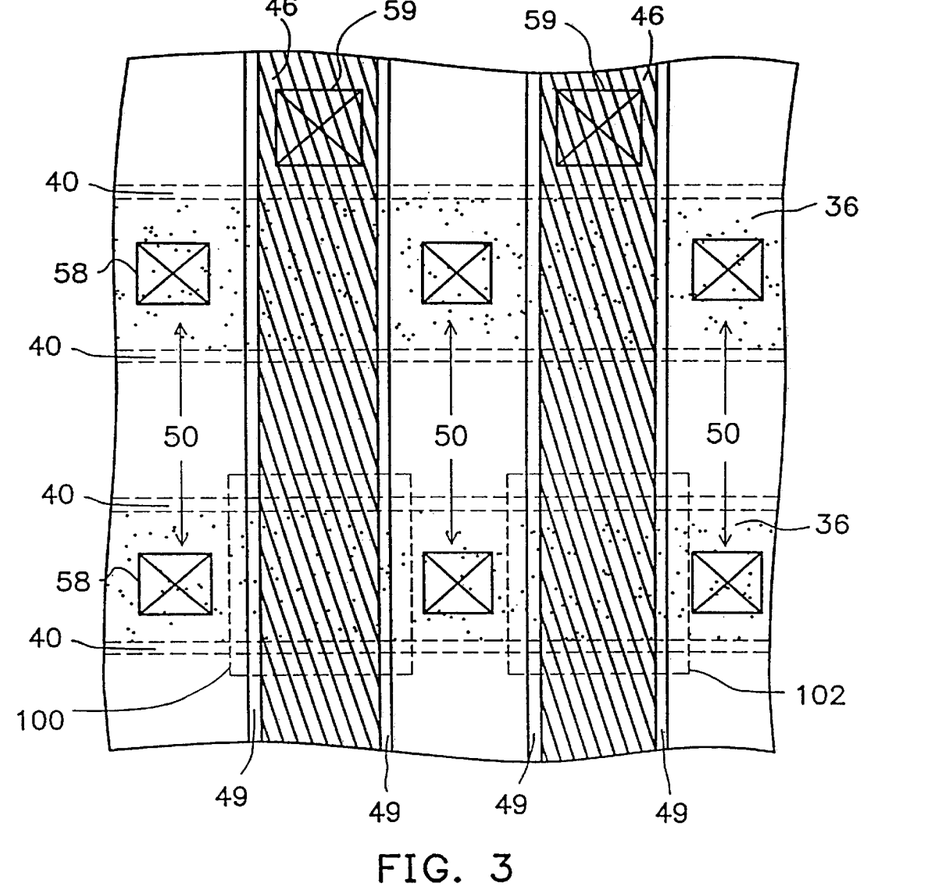
FIG. 3 is a schematic top plan view of the finished product of a preferred embodiment of the ROM device.
Figure 4:
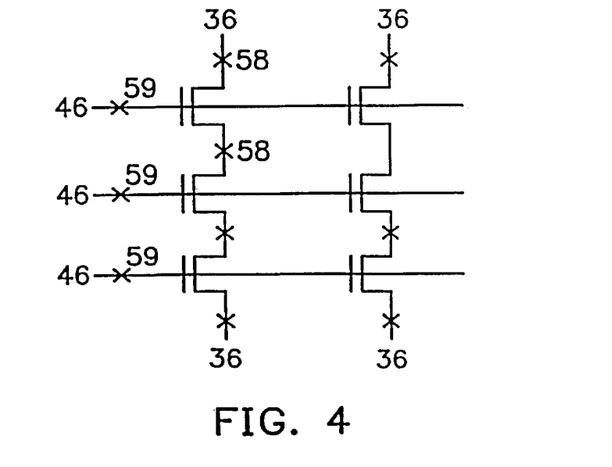
FIG. 4 is an equivalent circuit diagram of a portion of the finished product of the ROM device depicted in FIG. 3.

FIG. 3 is a schematic top view of the ROM device, and FIG. 4 is an equivalent circuit diagram of a portion of the finished product of the ROM device. This diagram shows that an array of memory cells are formed at the intersections between the diffusion regions 36 and the gate regions 46. For example, the intersection that is enclosed in a dashed box indicated by the reference numeral 100 is one location where one OFF-state memory cell is formed, whereas the intersection that is enclosed in a dashed box indicated by the reference numeral 102 is one location where one ON-state memory cell is formed. The gate regions 46 serve as a plurality of word lines and the diffusion regions 36 serve as a plurality of bit lines for accessing the binary data stored in these memory cells. The accessing via these word lines and bit lines includes conventional techniques, which will not be detailed in this specification.

From the foregoing description, it will be appreciated that the ROM device fabricated in accordance with the method of the invention has several advantages over the prior art. First, since the SOI structure provides an insulating layer, i.e., the first insulating layer 32, for isolating the source/drain regions from the substrate, there is no leakage current that would otherwise occur at the junction between the source/drain regions and the substrate in conventional ROM devices. Second, the SOI structure further allows for the prevention of breakdown voltage that would occur at the junction between the source/drain regions and the substrate in conventional ROM devices. The operating voltage of the ROM device of the invention can thus be increased.

In the foregoing detailed disclosure of the invention, the first semiconductor type is P-type while the second semiconductor type is N-type. However, in various other embodiments, the first semiconductor type can be N-type while the second semiconductor type can be P-type.

The invention has been described using exemplary preferred embodiments. However, it is to be understood that the scope of the invention is not limited to the disclosed embodiments.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a ROM device, comprising the steps of:

(1) preparing a semiconductor substrate, and forming a first insulating layer over the substrate;

(2) forming an intrinsic amorphous-silicon layer over the first insulating layer;

(3) removing portions of the intrinsic amorphous-silicon layer to form a plurality of substantially parallel spaced diffusion regions serving as bit lines oriented in a first direction;

(4) performing an ion-implantation process on the diffusion regions to dope an impurity material of a first conductivity type into the diffusion regions, and to adjust a threshold voltage of the diffusion regions to a level;

(5) forming a plurality of first sidewall spacers, each on a sidewall of the diffusion regions;

(6) forming a second insulating layer over exposed surfaces of the first insulating layer, the diffusion regions, and the first sidewall spacers;

(7) forming a conductive layer over the second insulating layer;

(8) removing portions of the conductive layer to form a plurality of substantially parallel spaced gate regions serving as word lines, oriented in a second direction overlapping the bit lines, the overlapped portions of the gate regions and the diffusion regions defining locations for forming an array of memory cells, the diffusion regions being partitioned into a plurality of channel regions located beneath the gate regions and a plurality of source/drain regions located between the channel regions;

(9) forming a plurality of second sidewall spacers, each on a sidewall of the gate regions;

(10) disposing a mask layer over exposed surfaces of the second insulating layer, the gate regions and the second sidewall spacers, and selectively removing portions of said mask layer to expose first locations on the gate regions for forming a first selected group of the memory cells to be set to a permanently-OFF state, and to prevent exposure of second locations on the gate regions for forming a second selected group of the memory cells to be set to a permanently-ON state;

(11) performing an ion-implantation process for doping an impurity material of a second conductivity type into the channel regions under the exposed gate regions, doped channel regions being part of the memory cells to be set to a permanently-OFF state, and undoped channel regions being part of the memory cells to be set to a permanently-ON state;

(12) forming a third insulating layer to cover the exposed surfaces of the second insulating layer, the gate regions, and the second sidewall spacers;

(13) forming a plurality of source/drain contact windows and gate contact windows extending through the third insulating layer and the second insulating layer, wherein:
the source/drain contact windows expose all of the source/drain regions; and
the gate contact windows expose a selected number of locations on the gate regions associated with the ON-state memory cells; and (14) filling the source/drain contact windows and the gate contact windows with a conductive material for forming respectively a plurality of gate electrodes in the gate contact windows and a plurality of source/drain electrodes in the source/drain contact windows.

2. The method of claim 1, wherein the first conductivity type is P-type and the second conductivity type is N-type.

3. The method of claim 1, wherein the first conductivity type is N-type and the second conductivity type is P-type.

4. The method of claim 1, wherein the first insulating layer is made of silicon dioxide.

5. The method of claim 1, wherein the intrinsic amorphous-silicon layer is formed by plasma enhanced chemical-vapor deposition.

6. The method of claim 1, wherein the first sidewall spacers are formed from silicon dioxide.

7. The method of claim 1, wherein the first sidewall spacers are formed from silicon nitride.

8. The method of claim 1, wherein the second insulating layer is formed from silicon dioxide.

9. The method of claim 1, wherein the second insulating layer is formed from silicon nitride.

10. The method of claim 1, wherein the conductive layer is an impurity-doped polysilicon layer.

11. The method of claim 1, wherein the second direction is substantially at a right angle with respect to the first direction.

12. The method of claim 1, wherein the second sidewall spacers are formed form silicon nitride.

13. The method of claim 1, wherein the second sidewall spacers are formed form silicon dioxide.

14. The method of claim 1, wherein the third insulating layer is a planarized layer of borophosphosilicate glass.

15. The method of claim 1, wherein the conductive material is a metal.

16. A ROM device, comprising:
a semiconductor substrate;
a first insulating layer formed over said substrate;
a plurality of substantially parallel-spaced diffusion regions formed over said first insulating layer oriented in a first direction for serving as bit lines;
a plurality of first sidewall spacers, each formed on a sidewall of said diffusion regions;
a second insulating layer covering said first insulating layer, said diffusion regions, and said first sidewall spacers;

a plurality of substantially parallel spaced gate regions formed over said second insulating layer, oriented in a second direction and serving as word lines overlapping said bit lines, overlapping portions of said gate regions and said diffusion regions defining an array of memory cells, said diffusion regions being partitioned into a plurality of channel regions located beneath said gate regions and a plurality of source/drain regions located between said channel regions, wherein a first selected group of channel regions are impurity-doped for forming a first group of the memory cells that are set to a permanently-OFF state, and a second selected group of channel regions are undoped for forming a second group of memory cells that are set to a permanently-ON state;

a plurality of second sidewall spacers, each formed on a sidewall of said gate regions;

a third insulating layer formed over said second insulating layer and said gate regions, said third insulating layer having a plurality of source/drain contact windows for exposing all of said source/drain regions on said diffusion regions, and a plurality of gate contact windows for exposing a selected number of locations on the gate regions associated with said ON-state memory cells;

a plurality of source/drain electrodes formed in the source/drain contact windows in said third insulating layer; and a plurality of gate electrodes formed in the gate contact windows in said third insulating layer.

17. The ROM device of claim 16, wherein said first insulating layer is made of silicon dioxide.

18. The ROM device of claim 16, wherein said first insulating layer is made of silicon nitride.

19. The ROM device of claim 16, wherein said diffusion regions comprise a plurality of impurity-doped amorphous-silicon layers.

20. The ROM device of claim 16, wherein said first sidewall spacers are formed from silicon dioxide.

21. The ROM device of claim 16, wherein said first sidewall spacers are formed from silicon nitride.

22. The ROM device of claim 16, wherein said second insulating layer is made of silicon dioxide.

23. The ROM device of claim 16, wherein said second insulating layer is made of silicon nitride.

24. The ROM device of claim 16, wherein said gate regions comprise a plurality of impurity-doped polysilicon layers.

25. The ROM device of claim 16, wherein said second direction is substantially at a right angle with respect to the first direction.

26. The ROM device of claim 16, wherein said second sidewall spacers are formed from silicon dioxide.

27. The ROM device of claim 16, wherein said second sidewall spacers are formed from silicon nitride.

28. The ROM device of claim 16, wherein said third insulating layer comprises a planarized layer of borophosphosilicate glass.

29. The ROM device of claim 16, wherein said gate electrodes are formed from a metal.

30. The ROM device of claim 16, wherein said source/drain electrodes are formed from a metal.

* * * * *